(12) United States Patent
Mori et al.

(10) Patent No.: US 8,384,083 B2
(45) Date of Patent: Feb. 26, 2013

(54) THIN-FILM TRANSISTOR HAVING HIGH ADHESIVE STRENGTH BETWEEN BARRIER FILM AND DRAIN ELECTRODE AND SOURCE ELECTRODE FILMS

(75) Inventors: Satoru Mori, Okegawa (JP); Shozo Komiyama, Sanda (JP)

(73) Assignees: Mitsubishi Materials Corporation, Tokyo (JP); Ulvac, Inc., Chigasaki-shi (JP)

( * ) Notice: Subject to any disclaimer, the term of this patent is extended or adjusted under 35 U.S.C. 154(b) by 0 days.

(21) Appl. No.: 12/998,283

(22) PCT Filed: Sep. 24, 2009

(86) PCT No.: PCT/JP2009/004823
§ 371 (c)(1),
(2), (4) Date: Apr. 5, 2011

(87) PCT Pub. No.: WO2010/047040
PCT Pub. Date: Apr. 29, 2010

(65) Prior Publication Data
US 2011/0193088 A1 Aug. 11, 2011

(30) Foreign Application Priority Data
Oct. 24, 2008 (JP) .................. 2008-273728

(51) Int. Cl.
*H01L 29/786* (2006.01)
(52) U.S. Cl. .............. 257/57; 257/44; 257/59; 257/66; 257/E29.291
(58) Field of Classification Search .............. 257/57, 257/66
See application file for complete search history.

(56) References Cited

U.S. PATENT DOCUMENTS

| | | | |
|---|---|---|---|
| 6,399,496 B1 | 6/2002 | Edelstein et al. | |
| 6,423,433 B1 | 7/2002 | Lopatin et al. | |
| 7,943,933 B2 * | 5/2011 | Hino et al. | 257/59 |
| 2006/0127606 A1 * | 6/2006 | Ogasawara et al. | 428/1.3 |

(Continued)

FOREIGN PATENT DOCUMENTS

| | | |
|---|---|---|
| CN | 101253610 A | 8/2008 |
| JP | 02-224254 A | 9/1990 |

(Continued)

OTHER PUBLICATIONS

International Search Report dated Oct. 20, 2009, issued for PCT/JP2009/004823.

(Continued)

*Primary Examiner* — Matthew W Such
*Assistant Examiner* — David Spalla
(74) *Attorney, Agent, or Firm* — Edwards Wildman Palmer LLP

(57) ABSTRACT

This thin-film transistor includes adhesive strength enhancing films between a barrier film and electrode films. Each of the adhesive strength enhancing film is composed of two zones including (a) a pure copper zone that is formed on the electrode film side, and (b) a component concentrated zone that is formed in an interface portion contact with the barrier film, and that includes Cu, Ca, oxygen, and Si as constituents. In concentration distributions of Ca and oxygen in a thickness direction of the component concentrated zone, a maximum content of Ca of a Ca-containing peak is in a range of 5 to 20 at %, and a maximum content of oxygen of an oxygen-containing peak is in a range of 30 to 50 at %, respectively.

1 Claim, 3 Drawing Sheets

U.S. PATENT DOCUMENTS

2008/0009108 A1 1/2008 Lin et al.
2009/0303406 A1 12/2009 Takasawa et al.

FOREIGN PATENT DOCUMENTS

| | | |
|---|---|---|
| JP | 04-349637 A | 12/1992 |
| JP | 08-026889 A | 1/1996 |
| JP | 2002-094069 A | 3/2002 |
| JP | 2004-163901 A | 6/2004 |
| JP | 2008-191541 A | 8/2008 |
| JP | 2008-205420 A | 9/2008 |
| JP | 2008-311283 A | 12/2008 |
| WO | WO-2008/081806 A1 | 7/2008 |

OTHER PUBLICATIONS

International Search Report dated Oct. 20, 2009, issued for PCT/JP2009/004822.

Office Action mailed Mar. 8, 2012, issued for U.S. Appl. No. 12/737,797.

Office Action dated Aug. 20, 2012, issued for the Chinese Patent Application No. 200980141877.X and English translation thereof.

Office Action mailed Aug. 3, 2012, issued for the Japanese Patent Application No. 2008-252241 and English translation thereof.

* cited by examiner

_US 8,384,083 B2_

THIN-FILM TRANSISTOR HAVING HIGH ADHESIVE STRENGTH BETWEEN BARRIER FILM AND DRAIN ELECTRODE AND SOURCE ELECTRODE FILMS

TECHNICAL FIELD

The present invention relates to a thin-film transistor used in various types of displays, and specifically the present invention relates to a thin-film transistor having high adhesive strength between a barrier film and a drain electrode film and high adhesive strength between a barrier film and a source electrode film (high adhesive strength between a barrier film and electrode films).

The present application claims priority on Japanese Patent Application No. 2008-273728, filed on Oct. 24, 2008, the content of which is incorporated herein by reference.

BACKGROUND ART

As flat-panel displays in which thin-film transistors driven by an active matrix method are used, a liquid crystal display, a plasma display, an organic EL display, an inorganic EL display and the like are known. In these flat-panel displays in which the thin-film transistors are used, wirings made of a metal film are formed to adhere to the surface of a glass substrate in a grid pattern, and thin-film transistors are provided at the intersections of the grid wirings made of the metal film.

As shown in a schematic vertical cross-sectional view of FIG. 3, it is well known that a thin-film transistor 110 includes a gate electrode film 2 of a pure copper film, a silicon nitride film 3, a Si semiconductor film 4, barrier films 5 of silicon oxide films, and electrode films 6 of pure copper films which are laminated in series on a surface of a glass substrate 1, and it is also known that the electrode films 6 consist of a drain electrode film of the pure copper film and a source electrode film of the pure copper film (both are indicated by "electrode films 6" in FIG. 3) which are partitioned by an isolation trench 8.

In a process of manufacturing the thin-film transistor 110 having such a laminated film structure, the isolation trench 8 that partitions the drain electrode film and the source electrode film is formed by wet etching and plasma etching. The surface of the Si semiconductor film 4 which is exposed at the bottom of the isolation trench 8 is in an extremely unstable state, and dangling bonds are increased therein. These dangling bonds become surface defects. The surface defects increase an off-current of the thin-film transistor. As a result, problems such as a decrease in the contrast of an LCD or a reduction in a viewing angle occur. In this manner, the surface of the Si semiconductor film 4 which is exposed at the bottom of the isolation trench 8 is in an unstable state where the occurrence of the above-mentioned problems cannot be avoided.

For this reason, it is known that hydrogen plasma processing is performed on the exposed surface of the Si semiconductor film 4 under the conditions where 100% of hydrogen gas is used, a hydrogen gas flow rate is in a range of 10 to 1000 SCCM, a hydrogen gas pressure is in a range of 10 to 500 Pa, an RF current density is in a range of 0.005 to 0.5 W/cm$^2$, and a processing time is in a range of 1 to 60 minutes; and thereby, the dangling bonds of the surface of the Si semiconductor film 4 are bound to hydrogen atoms to stabilize the surface thereof (see Patent Document 1).

On the other hand, large-sized screens and high integration of various types of flat-panel displays have been developed remarkably in recent years, and with this development, much higher adhesive strength tends to be required between each of the laminated films included in the thin-film transistor 110. In the above-mentioned conventional thin-film transistor 110, high adhesive strength capable of sufficiently satisfying the above-mentioned requirement is secured between the glass substrate 1 and the gate electrode film 2 of the pure copper film, between the gate electrode film 2 and the silicon nitride film 3, between the silicon nitride film 3 and the Si semiconductor film 4, and between the Si semiconductor film 4 and the barrier film 5 of the silicon oxide film. However, the adhesive strength between the barrier film 5 of the silicon oxide film and the electrode films 6 of the pure copper films (the drain electrode film and the source electrode film which are partitioned by the isolation trench 8) is relatively low, and the adhesive strength therebetween is not high enough to satisfy the above-mentioned requirement.

PRIOR ART DOCUMENTS

Patent Documents

Patent Document 1: Japanese Unexamined Patent Application, First Publication No. H04-349637

DISCLOSURE OF THE INVENTION

Problems to be Solved by the Invention

The present invention aims to provide a thin-film transistor having high adhesive strength between a barrier film and electrode films (high adhesive strength between a barrier film and a drain electrode film and high adhesive-strength between a barrier film and a source electrode film).

Means for Solving the Problems

From the above-mentioned viewpoint, the inventors have performed researches for the purpose of securing high adhesive strength between the barrier film of a silicon oxide film and the drain electrode film of a pure copper film, and high adhesive-strength between the barrier film of a silicon oxide film and the source electrode film of a pure copper film in a conventional thin-film transistor. Here, the drain electrode film and the source electrode film are partitioned by an isolation trench (hereinafter, simply referred to as the electrode films). As a result, the following research results were obtained.

(1) In a process of manufacturing the above-mentioned thin-film transistor, a Cu alloy film including Cu, Ca, and oxygen as constituents is formed between a barrier film 5 of a silicon oxide film, and each of electrode films 6 of pure copper films which are shown in a schematic vertical cross-sectional view of FIG. 1. The Cu alloy film is formed by sputtering with a Cu—Ca alloy target in an Ar+oxygen gas sputtering atmosphere in which oxygen gas is mixed.

In this Cu alloy film, during hydrogen plasma processing performed after the formation of the above-mentioned isolation trench 8, Ca included as an alloy component is diffused and moved to an interface portion contact with the above-mentioned barrier film 5 of the silicon oxide film, together with oxygen which is also included. Thereby, after the hydrogen plasma processing, the above-mentioned Cu alloy film becomes an adhesive strength enhancing film 7 composed of two zones including the following (a) and (b):

(a) a pure copper zone that is formed on the electrode film 6 (the pure copper film) side; and (b) a component concentrated zone that is formed in an interface portion contact with the barrier film 5, and that includes Cu, oxygen, Ca, and Si as constituents.

(2) The vertical cross-section in the thickness direction of the adhesive strength enhancing film 7 formed in the above (1) was analyzed by a scanning Auger electron spectroscopy analyzer. As a result, the following (c) and (d) were revealed as exemplified by a measurement result in FIG. 2:

(c) the pure copper zone is formed on the electrode film 6 side; and (d) on the other hand, the component concentrated zone in which each of oxygen-containing peak and Ca-containing peak exists is formed on the barrier film 5 side.

Here, in the analysis by the above-mentioned scanning Auger electron spectroscopy analyzer, the existence of the silicon oxide film (barrier film 5) having a small thickness cannot be confirmed. However, the existence thereof can be definitely confirmed through a texture observation by a transmission electron microscope.

(3) According to the test results, in the case where the maximum content of the oxygen-containing peak in the component concentrated zone is in a range of 30 to 50 at %, extremely high adhesive strength is obtained between the electrode film 6 and the barrier film 5. This adhesive strength is sufficiently large in terms of a strength that is required for large-sized screens and high integration of the flat-panel display.

Moreover, in the case where the maximum content of the Ca-containing peak is in a range of 5 to 20 at %, diffusion migration of oxygen towards the barrier film 5 side due to Ca is sufficiently performed; and as a result, the above-mentioned oxygen-containing peak of which maximum content is in a range of 30 to 50 at % can be obtained.

Since both of interfaces of the pure copper zone and the adjacent electrode film 6 are composed of pure copper having a high purity (purity of 99.9 at % or higher), extremely high adhesive strength is secured therebetween. In addition, since the above-mentioned electrode film 6 of the pure copper film retains a high purity of 99.9 at % or higher, a decrease in the electrical characteristics is not found in the above-mentioned electrode film 6.

(4) The adhesive strength enhancing film 7 that fulfills the conditions shown in the above (2) and (3) can be formed by the following method.

The Cu alloy film as mentioned in the above (1) is formed as follows. A Cu—Ca alloy target is prepared which contains Ca: 0.1 to 12 at % and the remainder being Cu and inevitable impurities. Oxygen gas is mixed with Ar gas at an amount in a range of 1 to 20 vol % relative to the total amount of oxygen gas and Ar gas so as to prepare an Ar+oxygen gas atmosphere. Sputtering is conducted by using the Cu—Ca alloy target in the Ar+oxygen gas atmosphere. Thereby, a Cu alloy film is formed which contains oxygen: 1 to 20 at %, Ca: 0.1 to 10 at %, and the remainder being Cu and inevitable impurities, by setting a desired film thickness to be in a range of 10 to 100 nm. As a result, the Cu alloy film mentioned in the above (1) can be formed. Then, the adhesive strength enhancing film 7 is formed by the above-mentioned hydrogen plasma processing.

The research results shown in the above (1) to (4) are obtained.

The present invention was conceived on the basis of the above-mentioned research results, and has the following features.

A thin-film transistor of the present invention has high adhesive strength between a barrier film and a drain electrode film, and high adhesive strength between a barrier film and a source electrode film, and includes a glass substrate, a gate electrode film of a pure copper film, a silicon nitride film, a Si semiconductor film, first and second barrier films of silicon oxide films, and electrode films of pure copper films, which are laminated in series on a surface of the glass substrate.

The electrode films include a drain electrode film and a source electrode film.

A first adhesive strength enhancing film having a thickness in a range of 10 to 100 nm is interposed between the first barrier film of the silicon oxide film and the drain electrode film of the pure copper film, and a second adhesive strength enhancing film having a thickness in a range of 10 to 100 nm is interposed between the second barrier film of the silicon oxide film and the source electrode film of the pure copper film.

The first adhesive strength enhancing film is composed of two zones including (a) a first pure copper zone which is formed on the side of the drain electrode film of the pure copper film, and (b) a first component concentrated zone that is formed in an interface portion contact with the first barrier film of the silicon oxide film, and that includes Cu, Ca, oxygen, and Si as constituents.

The second adhesive strength enhancing film is composed of two zones including (a) a second pure copper zone that is formed on the side of the source electrode film of the pure copper film, and (b) a second component concentrated zone that is formed in an interface portion contact with the second barrier film of the silicon oxide film, and that includes Cu, Ca, oxygen, and Si as constituents.

In concentration distributions of Ca and oxygen in a thickness direction of each of the first and second component concentrated zones, a maximum content of Ca of a Ca-containing peak is in a range of 5 to 20 at %, and a maximum content of oxygen of an oxygen-containing peak is in a range of 30 to 50 at %, respectively.

Here, the adhesive strength enhancing films are formed by the above-mentioned hydrogen plasma processing, and the requirements related to the adhesive strength enhancing film can be specified by analyzing the texture of the cross-section in the thickness direction by the scanning Auger electron spectroscopy analyzer.

Effects of the Invention

In accordance with the thin-film transistor of the present invention, the adhesive strength enhancing film having the above-mentioned configuration is interposed between the barrier film of the silicon oxide film and the electrode film of the pure copper film. Thereby, the adhesive strength between these films is dramatically improved. As a result, each of the laminated films included in the thin-film transistor is joined to each other with a strong adhesive strength. For this reason, it is possible to provide an extremely high adhesion between the films throughout its entirety which is required for large-sized screens and high integration of the flat-panel display.

BEST MODE FOR CARRYING OUT THE INVENTION

Figure 1:
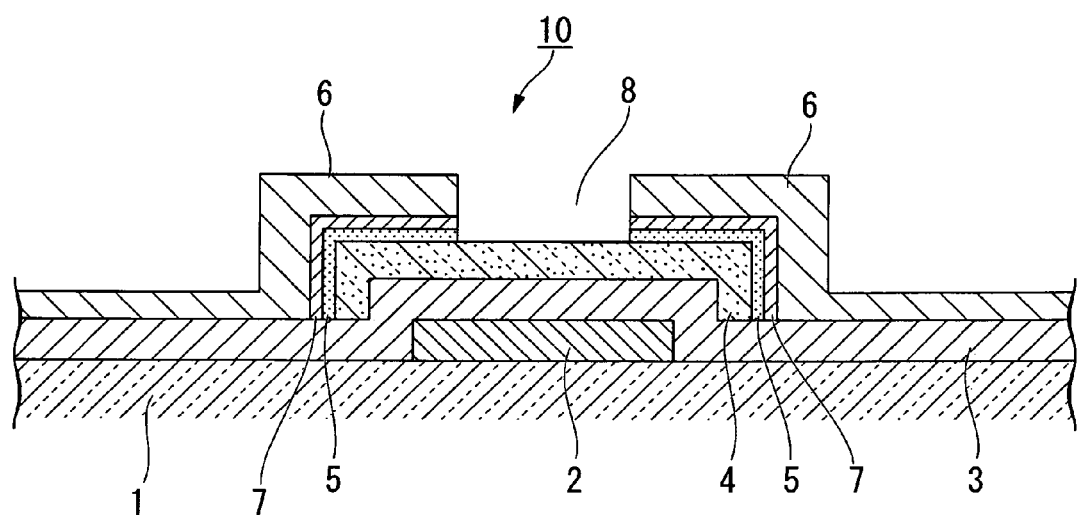
FIG. 1 is a schematic vertical cross-sectional view illustrating a thin-film transistor according to the present invention.

Next, the configuration of the present invention will be described in detail.

The reason for limiting conditions of an adhesive strength enhancing film 7 included in a thin-film transistor 1 of the present invention as mentioned above will be described.

(1) Maximum Content of Oxygen-Containing Peak in Component Concentrated Zone

In the case where the maximum content of oxygen is less than 30 at %, it is not possible to secure a sufficiently strong adhesive strength that is required for large-sized screens and high integration of a flat-panel display, between a component concentrated zone and an adjacent silicon oxide film (barrier film 5). On the other hand, in the case where the maximum content of oxygen exceeds 50 at %, a decrease in the strength of the component concentrated zone tends to appear, and this causes a delamination thereof. Accordingly, the maximum content of oxygen is set to be in a range of 30 to 50 at %.

(2) Maximum Content of Ca-Containing Peak in Component Concentrated Zone

In the case where the maximum content of Ca is less than 5 at %, during a hydrogen plasma processing, diffusion migration of oxygen towards the barrier film 5 side is not sufficiently achieved. As a result, it is difficult to obtain the oxygen-containing peak of which maximum content of oxygen is in a range of 30 to 50 at %. On the other hand, in the case where the maximum content of Ca exceeds 20 at %, a decrease in the strength of the component concentrated zone tends to appear. Accordingly, the maximum content of Ca is set to be in a range of 5 to 20 at %.

(3) Desired Film Thickness of Adhesive Strength Enhancing Film 7

In the case where the desired film thickness thereof is less than 10 nm, it is not possible to secure the strong adhesive strength between the barrier film 5 of the silicon oxide film and electrode films 6 of pure copper films. On the other hand, even in the case where the desired film thickness thereof exceeds 100 nm, a further enhanced effect is not obtained in the adhesive strength between these films. For this reason, the desired film thickness thereof is set to be in a range of 10 to 100 nm in consideration of economical efficiency.

Examples

Next, the adhesive strength between the barrier film of the silicon oxide film and the electrode film of the pure copper film in the thin-film transistor of the present invention will be described concretely while referring to examples.

In accordance with conventional conditions for forming films, a pure copper film (gate electrode film) having a thickness of 300 nm, a silicon nitride film having a thickness of 300 nm, a Si semiconductor film having a thickness of 150 nm, and a silicon oxide film (barrier film) having a thickness of 10 nm were laminated on the surface of a Corning 1737 glass substrate in series from the surface side of the glass substrate. The Corning 1737 glass substrate was manufactured by Corning Corporation and had dimensions of 320 mm long×400 mm wide×0.7 mm thick.

Cu—Ca alloys (including Cu and inevitable impurities except for Ca) having Ca contents shown in Table 1 were melted and prepared. The glass substrate having the above-mentioned films was put in a sputtering system. Oxygen gas is mixed with Ar gas at an amount shown in Table 1 relative to the total amount of oxygen gas and Ar gas so as to prepare an Ar+oxygen gas atmosphere. Sputtering is conducted by using one of the Cu—Ca alloys as a target in the Ar+oxygen gas atmosphere. Thereby, a Cu alloy film having each composition shown in Table 1 was formed on the above-mentioned silicon oxide film (barrier film) with a desired film thickness shown in Table 1. Here, the composition of the Cu alloy film shown in Table 1 is a measurement result obtained by the scanning Auger electron spectroscopy analyzer.

Further, the pure copper film (electrode film) having a purity of 99.9 at % and a thickness of 250 nm was formed on each of the above-mentioned various types of Cu alloy films. Subsequently, hydrogen plasma processing was performed under the following conventional conditions; and thereby, the above-mentioned Cu alloy film was changed into an adhesive strength enhancing film. From the above, thin-film transistor samples 1 to 10 of inventive examples were manufactured.

(Conditions of Hydrogen Plasma Processing)

Gas: 100% of hydrogen gas, a hydrogen gas flow rate: 500 SCCM, a hydrogen gas pressure: 100 Pa, a treatment temperature: 300° C., an RF power flow density: 0.1 W/cm$^2$, and a processing time: two minutes.

In addition, for comparison purposes, a thin-film transistor sample of a conventional example was manufactured under the same conditions except that the adhesive strength enhancing film (Cu alloy film) was not formed.

With respect to the obtained thin-film transistor samples 1 to 10 of the inventive examples, cross-sections thereof in the thickness direction were analyzed by a sample inclined rotation method (Zalar rotation method) using a scanning Auger electron spectroscopy analyzer. A change of purity in the film thickness direction in the pure copper film (electrode film) of a surface portion was observed. Further, the maximum contents of an oxygen-containing peak and a Ca-containing peak in a component concentrated zone of the adhesive strength enhancing film were measured, and these measurement results are shown in Table 1.

Figure 2:
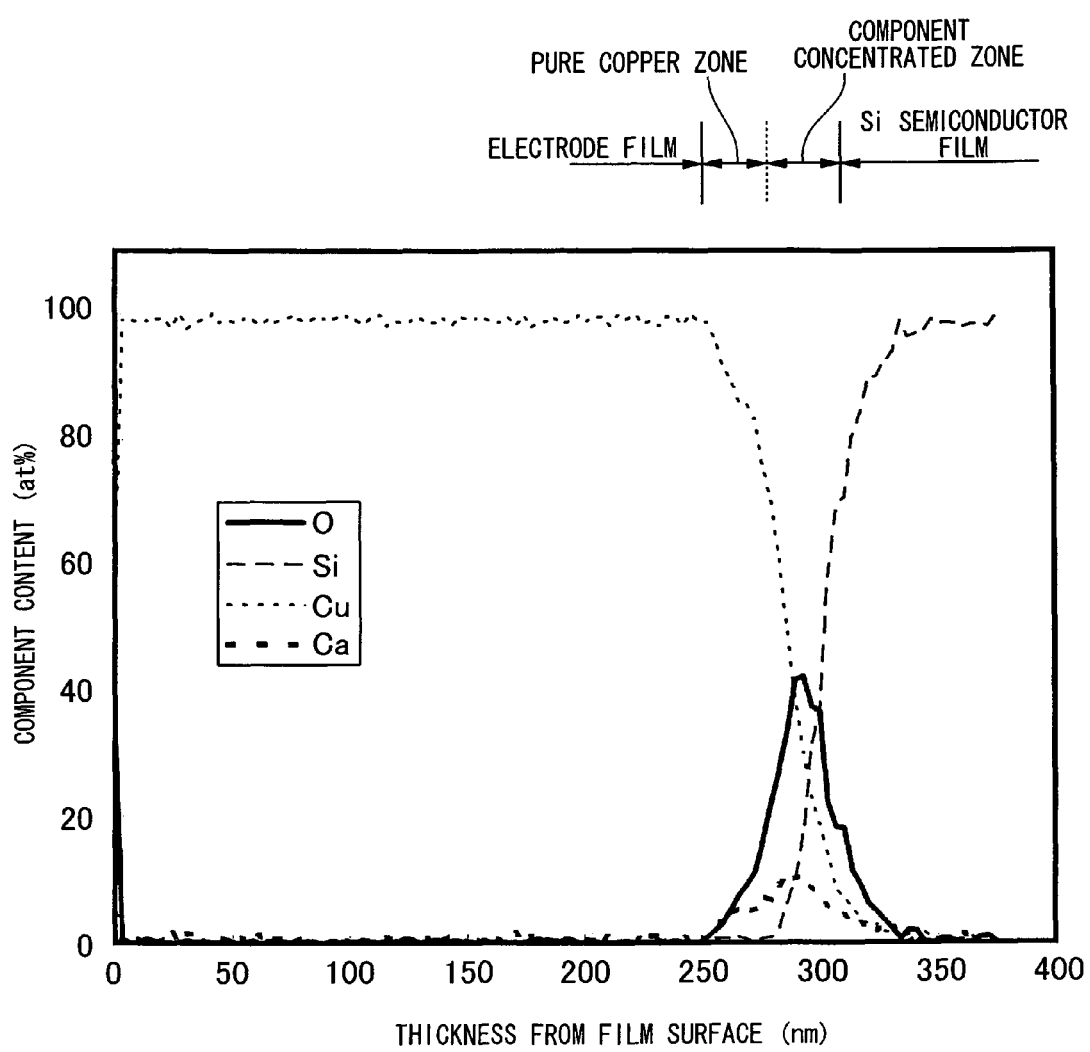
FIG. 2 is a graph illustrating a measurement result of a thin-film transistor sample 4 of the inventive example measured by a scanning Auger electron spectroscopy analyzer.
Figure 3:
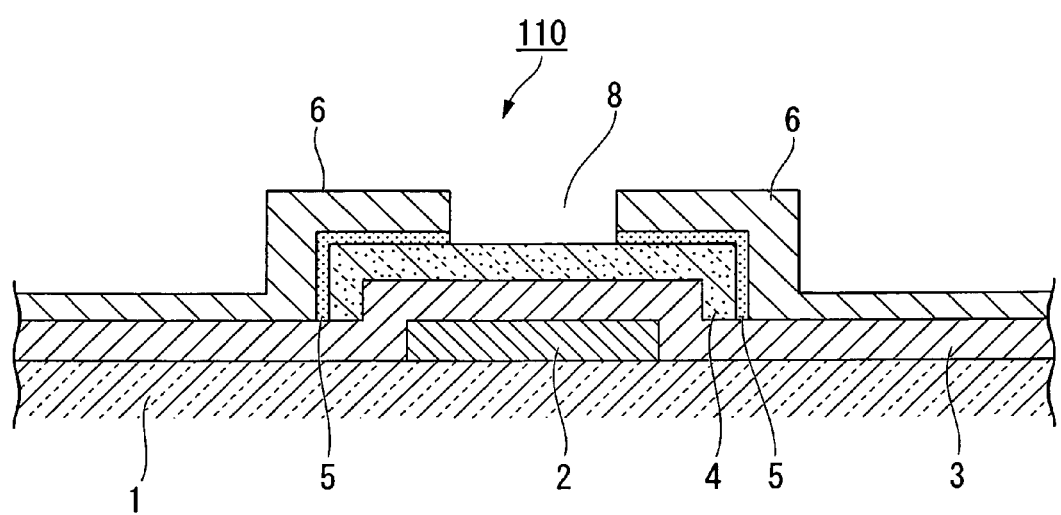
FIG. 3 is a schematic vertical cross-sectional view illustrating a conventional thin-film transistor.

FIG. 2 is a measurement result of the thin-film transistor sample 4 of the inventive example measured by the scanning Auger electron spectroscopy analyzer. By this analyzer, the existence of the silicon oxide film (barrier film) having a small thickness (10 nm) could not be confirmed. However, through a texture observation by a transmission electron microscope, it was confirmed that the silicon oxide film (barrier film) existed between the adhesive strength enhancing film (component concentrated zone) and the Si semiconductor film.

In addition, as shown in FIG. 2, the pure copper film (electrode film) in the surface portion of the above-mentioned sample 4 had a purity of 99.9 at % or higher along the thickness direction. It was also found that, in all of the samples other than sample 4, the pure copper film (electrode film) had a purity of 99.9 at % or higher, like the above-mentioned sample 4.

Further, the cross cut adhesion test was performed under the following conditions for the purpose of confirming the adhesive strength between the silicon oxide film (barrier film) and the pure copper film (electrode film) of the obtained thin-film transistor sample.

Cross Cut Adhesion Test:

In accordance with JIS-K5400, 11-by-11 grooves (notches) were formed in the surface of the above-mentioned sample by using a cutter, at an interval selected from 0.5 mm, 1 mm, 1.5 mm, and 2 mm, at a depth reaching the silicon oxide film from the surface and at a groove width of 0.1 mm. Thereby, 100 cells (squares) were formed at each of the intervals. A Scotch tape manufactured by 3M was adhered throughout the squares, and then was taken away from the surface at once. The number (number/100) of squares peeled off among the hundred squares in the sample surface was measured. This measurement result is shown in Table 2.

TABLE 1

| | | Conditions of forming Cu alloy film | | | | | Component concentrated zone in adhesive strength enhancing film | |
|---|---|---|---|---|---|---|---|---|
| | | | Oxygen content in sputtering atmosphere (vol %) | Composition of Cu alloy film (at %) | | | Maximum content of oxygen-containing peak (at %) | Maximum content of Ca-containing peak (at %) |
| Type | | Ca content in target (at %) | | Ca | Oxygen | Cu + impurities | Desired film thickness (nm) | | |
| Thin-film transistor samples of inventive examples | 1 | 0.1 | 1 | 0.1 | 1.1 | remainder | 10 | 30.3 | 5.1 |
| | 2 | 0.5 | 2 | 0.4 | 2.4 | remainder | 20 | 32.5 | 5.8 |
| | 3 | 0.7 | 5 | 0.6 | 4.9 | remainder | 40 | 34.8 | 6.0 |
| | 4 | 1.1 | 10 | 0.9 | 8.2 | remainder | 60 | 37.0 | 6.3 |
| | 5 | 1.5 | 10 | 1.2 | 10.2 | remainder | 50 | 39.5 | 6.8 |
| | 6 | 2.1 | 10 | 1.7 | 11.3 | remainder | 60 | 41.8 | 7.5 |
| | 7 | 3.8 | 15 | 3.5 | 14.1 | remainder | 70 | 43.5 | 10.3 |
| | 8 | 5.7 | 15 | 4.6 | 15.4 | remainder | 80 | 45.0 | 11.9 |
| | 9 | 8.6 | 18 | 6.9 | 18.0 | remainder | 90 | 47.3 | 15.4 |
| | 10 | 11.8 | 20 | 9.9 | 19.5 | remainder | 100 | 49.8 | 19.8 |

TABLE 2

| | | Number of squares peeled off (number/100) Square dimensions (mm□) | | | |
|---|---|---|---|---|---|
| Type | | 0.5 mm | 1 mm | 1.5 mm | 2 mm |
| Thin-film transistor samples of inventive examples | 1 | 7 | 0 | 0 | 0 |
| | 2 | 4 | 0 | 0 | 0 |
| | 3 | 0 | 0 | 0 | 0 |
| | 4 | 1 | 0 | 0 | 0 |
| | 5 | 0 | 0 | 0 | 0 |
| | 6 | 2 | 0 | 0 | 0 |
| | 7 | 0 | 0 | 0 | 0 |
| | 8 | 1 | 0 | 0 | 0 |
| | 9 | 0 | 0 | 0 | 0 |
| | 10 | 0 | 0 | 0 | 0 |
| Thin-film transistor sample of conventional example | | 100 | 100 | 72 | 54 |

From the results shown in Tables 1 and 2, it was found that through the adhesive strength enhancing film interposed between the silicon oxide film (barrier film) and the pure copper film (electrode film), each of the thin-film transistor samples 1 to 10 of the inventive examples had an extremely higher adhesive strength between the two films than that of the thin-film transistor sample of the conventional example in which the above-mentioned adhesive strength enhancing layer was not formed, and as a result, adhesion between the constituent films became high as a whole.

As described above, the thin-film transistor of the present invention can sufficiently fulfill the requirements that are required for large-sized screens and high integration of the flat-panel display.

INDUSTRIAL APPLICABILITY

In recent years, with large-sized screens and high integration of the flat-panel display, much higher adhesive strength has been required in the laminated film included in the thin-film transistor. The thin-film transistor of the present invention has extremely high adhesive strength between the barrier film and the electrode films (high adhesive strength between the barrier film and a drain electrode film and high adhesive-strength between the barrier film and a source electrode film); and as a result, the above-mentioned requirement can be fulfilled sufficiently. Therefore, the thin-film transistor of the present invention can be suitably used as a thin-film transistor for a flat-panel display in which large-sized screens and high integration are applied.

BRIEF DESCRIPTION OF REFERENCE SIGNS

1: GLASS SUBSTRATE, 2: GATE ELECTRODE FILM, 3: SILICON NITRIDE FILM, 4: Si SEMICONDUCTOR FILM, 5: BARRIER FILM, 6: ELECTRODE FILM, 7: ADHESIVE STRENGTH ENHANCING FILM, 8: ISOLATION TRENCH, 10: THIN-FILM TRANSISTOR OF THE PRESENT INVENTION, 110: CONVENTIONAL THIN-FILM TRANSISTOR

The invention claimed is:

1. A thin-film transistor having high adhesive strength between a barrier film and a drain electrode film, and high adhesive strength between a barrier film and a source electrode film, comprising:
   a glass substrate, a gate electrode film of a pure copper film, a silicon nitride film, a Si semiconductor film, first and second barrier films of silicon oxide films, and electrode films of pure copper films, which are laminated in series on a surface of the glass substrate,
   wherein the electrode films comprise a drain electrode film and a source electrode film,
   a first adhesive strength enhancing film having a thickness in a range of 10 to 100 nm is interposed between the first barrier film of the silicon oxide film and the drain electrode film of the pure copper film, and a second adhesive strength enhancing film having a thickness in a range of 10 to 100 nm is interposed between the second barrier film of the silicon oxide film and the source electrode film of the pure copper film,
   the first adhesive strength enhancing film is composed of two zones including (a) a first pure copper zone that is formed on the side of the drain electrode film of the pure copper film, and (b) a first component concentrated zone that is formed in an interface portion contact with the first barrier film of the silicon oxide film, and that includes Cu, Ca, oxygen, and Si as constituents,
   the second adhesive strength enhancing film is composed of two zones including (a) a second pure copper zone that is formed on the side of the source electrode film of the pure copper film, and (b) a second component concentrated zone that is formed in an interface portion contact with the second barrier film of the silicon oxide film, and that includes Cu, Ca, oxygen, and Si as constituents, and in concentration distributions of Ca and oxygen in a thickness direction of each of the first and second component concentrated zones, a maximum content of Ca of a Ca-containing peak is in a range of 5 to 20 at %, and a maximum content of oxygen of an oxygen-containing peak is in a range of 30 to 50 at %, respectively.

* * * * *